(12) United States Patent
Ramstein

(10) Patent No.: US 7,157,190 B2
(45) Date of Patent: Jan. 2, 2007

(54) METHOD FOR REPAIRING A PHOTOLITHOGRAPHIC MASK, AND A PHOTOLITHOGRAPHIC MASK

(75) Inventor: Marcus Ramstein, Dresden (DE)

(73) Assignee: Infineon Technologies AG, Munich (DE)

( * ) Notice: Subject to any disclaimer, the term of this patent is extended or adjusted under 35 U.S.C. 154(b) by 174 days.

(21) Appl. No.: 10/703,298

(22) Filed: Nov. 6, 2003

(65) Prior Publication Data

US 2004/0146787 A1    Jul. 29, 2004

(30) Foreign Application Priority Data

Nov. 7, 2002    (DE) ................. 102 53 073

(51) Int. Cl.
*G03F 1/00*    (2006.01)
(52) U.S. Cl. ............................................ 430/5
(58) Field of Classification Search .......... 430/5, 430/30; 250/492.21, 492.23, 492.3
See application file for complete search history.

(56) References Cited

U.S. PATENT DOCUMENTS

| | | | |
|---|---|---|---|
| 4,548,883 A | 10/1985 | Wagner | |
| 6,335,129 B1* | 1/2002 | Asano et al. | 430/5 |
| 6,346,352 B1* | 2/2002 | Hayden et al. | 430/5 |
| 6,368,753 B1 | 4/2002 | Harriott et al. | |
| 6,447,962 B1 | 9/2002 | Yang | |
| 6,534,223 B1* | 3/2003 | Yang | 430/5 |
| 2003/0077524 A1* | 4/2003 | Choi | 430/5 |

FOREIGN PATENT DOCUMENTS

| | | |
|---|---|---|
| DE | 3420353 C2 | 12/1984 |
| DE | 10158339 A1 | 5/2003 |

* cited by examiner

Primary Examiner—S. Rosasco
(74) Attorney, Agent, or Firm—Slater & Matsil, L.L.P.

(57) ABSTRACT

A method for repairing at least one defect of a light-influencing structure on a photolithographic mask with a mask substrate, in particular a quartz substrate, characterized in that in the region of at least one defect, gallium ions are radiated in a targeted manner for the purpose of implantation into the mask substrate and/or for the purpose of sputtering away material from the mask substrate. Furthermore, the invention relates to a photolithographic mask with a defect repaired in this way. As a result, defects in a light-influencing structure of a mask can be reliably repaired, and are repaired, respectively.

15 Claims, 4 Drawing Sheets

METHOD FOR REPAIRING A PHOTOLITHOGRAPHIC MASK, AND A PHOTOLITHOGRAPHIC MASK

FIELD OF THE INVENTION

The present invention is directed to photolithographic fabrication techniques, and more particularly relates to a method for repairing a photolithographic mask.

BACKGROUND OF THE INVENTION

Photolithographic masks for the fabrication of semiconductor components typically include light-influencing structures formed on a mask substrate (e.g., a quartz substrate).

A light-influencing structure is understood here to be any structure on the mask substrate which influences light of the photolithographic process in a specific manner in order to image a structure e.g. on a wafer.

Such a light-influencing structure may be highly absorbent, but may also be part of a halftone phase mask, whose light-influencing structure transmits light in part (approximately 6%) but simultaneously brings about a phase shift of the light by 180°. In principle, however, a reflective layer may also be regarded as light-influencing.

In the case of halftone phase masks, e.g., a molybdenum-silicon compound. (MoSi) is used as the light-influencing material. By utilizing interference effects in the phase shift, it is possible to achieve a larger process window during the wafer exposure and processing than would be possible with the use of an absorber which absorbs 100% of the light.

On account of the cost savings demanded and the technological competition that exists, there is a continuous trend towards shrinking structures on a chip. This requires a reduction of the detail sizes of the light-influencing structures on the photo mask with which the structures are produced on the chip.

As the structures become smaller and smaller, the light-influencing structures of the mask must be prevented from having defects. If, at one location, e.g., too little light-absorbing material is applied on the quartz substrate of the mask or too much absorber material is removed during the patterning of the mask, then too much light is transmitted and a bright defect arises on the wafer.

Although the problem of defects exists in principle in the photolithographic methods, it is the case that as the structures become ever smaller, the tolerances for defects also become smaller. For this reason, repair methods that work ever more finely are required.

Methods for repairing defects of light-influencing structures are known in principle. Thus, use is made of a gas-assisted deposition of a carbon film onto a defect with the aid of an ion beam installation.

In this case, use is made of customary ion beam installations with gallium as ion beams. Good beam shapes and the required beam intensity can thus be achieved. With the aid of the gallium ions, by means of gas-assisted processes, either excess absorber material is removed on a photolithographic mask ("gas assisted etching") or missing absorber material is replaced by the application of a carbon film.

The gallium ions have a supporting function in this case in that they excite process gases present in order that either a chemical reaction with the absorber material of the photo mask (gas assisted etching) can take place or that carbon atoms from the gas phase can be deposited onto the mask as a carbon layer.

The gallium ions have the property of absorbing light in an intensified manner the shorter the exposure wavelength with which the photolithographic mask is exposed. Hitherto, this property has not been used for the repair of masks, in particular halftone phase masks, and has been regarded rather as a disturbing side effect.

Since the dielectric properties of the applied carbon film and of the light-influencing MoSi layer differ, the following disadvantage is manifested, which becomes apparent in an intensified manner towards smaller feature sizes and large-area defects: the light transmission at the defect location differs from that at undamaged comparison locations despite repair. This difference in light transmission is at the margin of the allowed specification in the case of small line widths (line widths on the photo mask of less than 440 nm).

SUMMARY OF THE INVENTION

The present invention is based on the object of providing a method for fabricating a photolithographic mask, and a photolithographic mask, in which even small defects in a light-influencing structure can be reliably repaired, and are repaired, respectively.

This object is achieved according to the invention by means of a method having the features described below.

By virtue of the fact that, in the region of at least one defect of a light-influencing structure, gallium ions are radiated in a targeted manner for the purpose of implantation into the mask substrate and/or for the purpose of sputtering away material from the mask substrate, the dielectric properties of the mask substrate are changed, so that a repair effect occurs. In the event of an exposure, e.g., of a wafer with the mask repaired according to the invention, the structure to be imaged is printed correctly within the specifications. This method is suitable, in principle, for the repair of defects of light-influencing structures (e.g. absorbent, phase-shifting and/or reflective structures) on masks.

Since no carbon film is applied to the defect, a defect repaired according to the invention is not impaired even during a cleaning of the mask. Photolithographic masks are cleaned a number of times during the fabrication process in order to remove contaminants from the surface. Contaminants due to particles represent a major problem and, despite clean room conditions, even in the area of inspection/repair, require cleaning after specific work steps. Sometimes a work step has to be implemented repeatedly, which increases the number of cleaning processes carried out. It has been found that the cleaning chemical used influences deposited carbon layers: the layer is attacked or completely removed depending on the number and type of cleaning processes. In the case of the method according to the invention, no material is deposited, rather material is removed by being sputtered away. Since the implanted gallium ions are also not attacked by the cleaning, the repair location is not adversely affected by a cleaning step.

The irradiation is advantageously performed with an ion beam of a standard ion beam installation. The use of a standard installation makes it possible to achieve a particularly economic procedure.

It is particularly advantageous if the irradiation of the defect location with gallium ions is effected without gas assistance. It is known that mask and ion beam execute fluctuating drift motions. During gas-assisted processes, such as during the deposition of the carbon layer, the corresponding gas is admitted into the vacuum chamber of the installation and interacts with the ion beam. One of the interactions is the desired effect of carbon deposition onto the surface of the mask. Undesirable interactions are collision processes between the gas molecules and the gallium ions and Coulomb interactions, which lead to the expansion and uncontrolled deflection of the ion beam, and thus to the further impairment of the positioning accuracy in addition to the drift effects. Halo effects, known from locations repaired with carbon film, are also avoided. In this connection, a halo is understood to be a haze or a kind of corona around the repaired defect.

It is advantageous if the repair result of the defect is controlled through selection of the gallium ion dose and/or the size of the repair area. It is also advantageous if the repair result of the defect can be controlled through selection of the acceleration voltage of the gallium ions, the number of scanning points when scanning the defect and/or the residence duration of the gallium ion beam on a scanning point.

In a particularly advantageous embodiment of the method according to the invention, the defect repaired is a bright defect of a molybdenum-silicon structure on the mask substrate.

The object is also achieved by means of a photolithographic mask in accordance with the features described below.

A mask according to the invention has at least one region in which gallium ions are implanted in a targeted manner for the purpose of repairing a defect in a light-influencing structure in the mask substrate, and/or a region in which, by means of gallium ions, targeted sputter-away portions are present in the mask substrate.

The photolithographic mask is advantageously designed for an exposure wavelength of 193 nm, 157 nm or 13 nm.

It is also advantageous if the light-influencing structure, in particular a molybdenum-silicon structure, is designed as part of a halftone phase mask.

The invention is explained in more detail below using a plurality of exemplary embodiments with reference to the figures of the drawings.

DETAILED DESCRIPTION OF THE PREFERRED EMBODIMENT

The text below will explain first of all with reference to FIGS. 1 to 3 how conventional repair methods work and what results can be achieved in this case. The advantageous effects of the method according to the invention will then be explained with reference to FIGS. 4 and 5. All experiments were carried out at exposure wavelengths of 193 nm.

Figure 1:
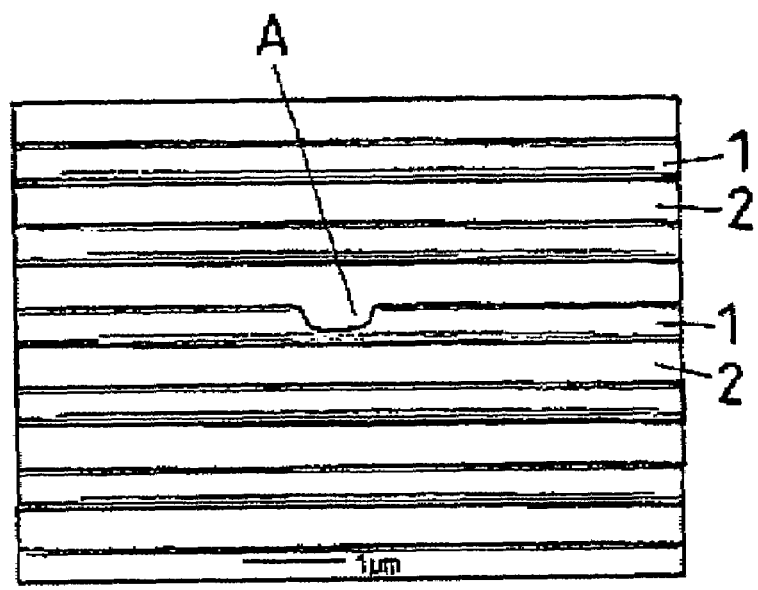
FIG. 1 illustrates a scanning electron microscope recording of a defect in a light-absorbing structure.

FIG. 1 shows a trace of a scanning electron microscope recording of a light-influencing structure 1 on a mask with a quartz substrate 2. Here and in the other examples provided below an MoSi structure is used as the light-influencing structure 1, it being possible to use basic including additionally or alternatively absorbent and/or reflective structures 1.

In FIG. 1, the defect A is clearly discernible as a constriction of the structure width. The aim of the mask repair method is to eliminate such defects A. In the region of the defect, too much light is transmitted, i.e., the result is an overexposure of the substrate to be exposed, e.g., a wafer.

Figure 2:
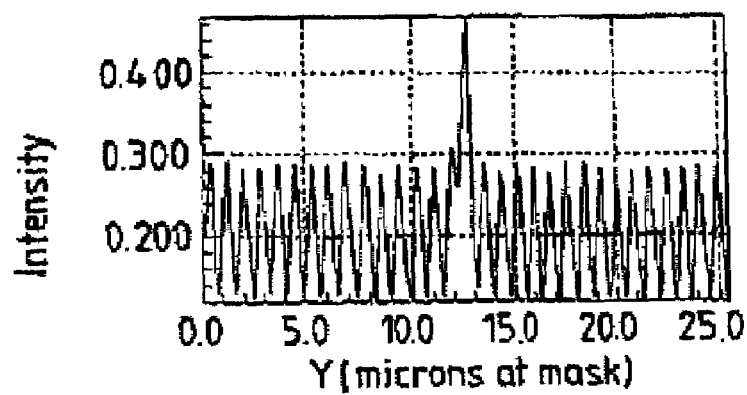
FIG. 2 shows a measurement result (AIMS) of the light transmission in the region of the light-absorbing structure in accordance with FIG. 1.

FIG. 2 illustrates this partial overexposure, lying beyond the permissible tolerance, in the form of a measurement result using the AIMS microscope (Aerial Image Measurement System Microscope). This microscope simulates the intensity distribution on the wafer, i.e. the effect of the defect.

A measurement distance on the mask in micrometers is plotted on the x-axis and the measured values for the intensity are plotted on the y-axis. The quartz substrate without an absorbent material has an intensity of 1. It can clearly be seen that the intensity in the region of the defect location (0.46) is almost twice as high as in the region of the intact structure (0.29).

Figure 3A:
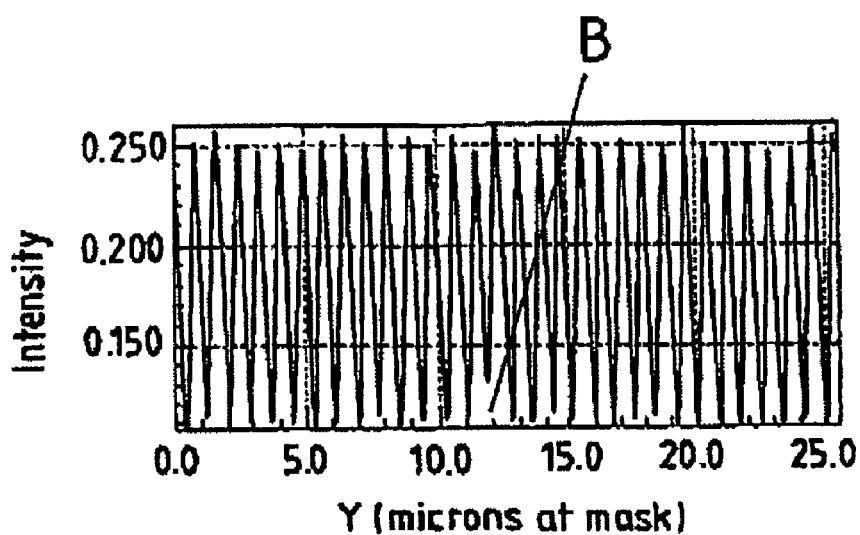
FIG. 3A shows a measurement of the light transmission of a defect repaired with a carbon film.
Figure 3B:
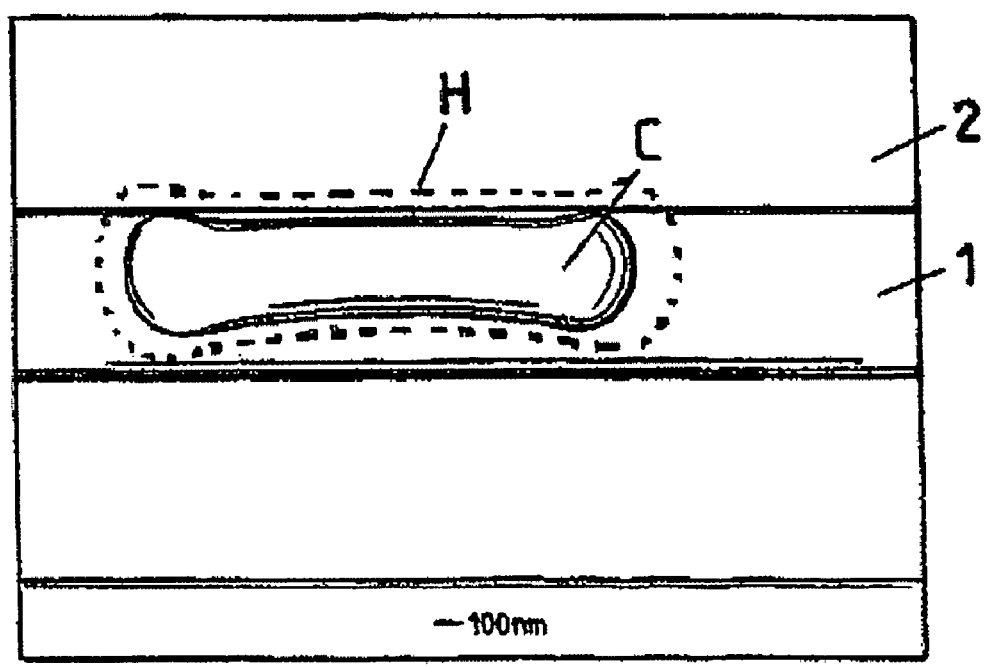
FIG. 3B illustrates a scanning electron microscope recording of a deposited carbon film.

FIGS. 3A and 3B illustrate a repair as is known from the prior art.

FIG. 3A shows the AIMS measurement result of a structure with a bright defect which has been repaired with a carbon film.

The cross section shows an increased transmission at a minimum. The permissible specification for the photolithographic mask is 10% of the amplitude from minimum to maximum.

In the example illustrated, however, the deviation B is +15%. The deviation B is so large here that the specification is not fulfilled.

A deposition of a carbon layer having a larger area or a change in its position relative to the defect A may lead to a lower transmission at the minimum, but at the same time also results in a change in the transmission of the adjacent maxima.

FIG. 3B illustrates a scanning electron microscope recording of a deposited carbon film C (does not correspond to the example from FIG. 3A), which is intended to eliminate a defect in a light-influencing structure 1. The light-influencing structure 1 is arranged on a quartz substrate 2.

A rectangular elevation with rounded portions at the corners can clearly be seen at the carbon film C. Above the carbon film, a region H can be seen which is bounded by a circle arc, which represents the so-called halo, which additionally adversely effects the light transmission since the carbon film C does not have a sharp edge for this reason.

Figure 4A:
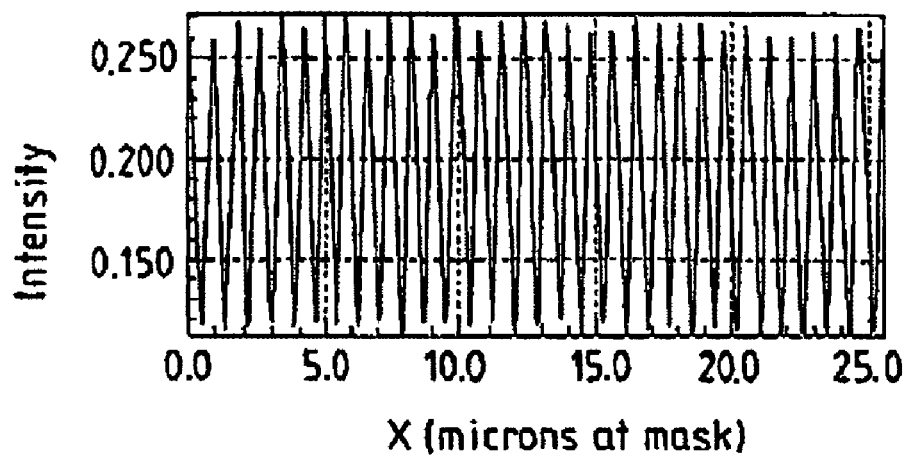
FIG. 4A shows a measurement result (AIMS) of the light transmission of a defect repaired by the method according to the invention.

FIG. 4A illustrates an AIMS measurement result obtained at a location which was repaired by the method according to the invention. The unrepaired location corresponded to the defect as illustrated in FIG. 1, but rotated through 90°. The defect location was irradiated in a targeted manner with a gallium ion stream, so that gallium ions are implanted into the mask substrate in a gas-free manner. At the location of the bright defect (i.e., where MoSi material is missing), gallium ions are implanted into the quartz substrate of the photo mask in a targeted manner. This is done by means of the ion beam installation used in production, which is known per se and need not be described in any further detail here.

The repair result can be influenced through selection of the gallium ion dose and the size of the repair area.

The gallium ions have a high light absorption at a wavelength of 193 nm and also at a wavelength of 157 nm, which can be demonstrated by absorption spectra.

Together with the implantation of the gallium ions, a sputtering-away of quartz of the mask substrate is also achieved. As a result, an additional phase effect for the electric light is impressed on the mask substrate material at the repair location. The reduction of the substrate thickness as a result of the sputtering-away brings about an altered phase shift. Both effects, the light absorption of the implanted gallium ions and the phase effect in the partially sputtered-away quartz, lead to better light interference properties at the repair location than the carbon film used hitherto. The defects repaired according to the invention have dielectric properties which are closer to the properties of the MoSi material than those of the carbon film.

The method according to the invention affords a large process window in the selection of the repair parameters and therefore also exhibits the potential of being able to be used in the case of smaller feature sizes and large-area defects on the mask. Closely associated with this is the greater positional accuracy of the gas-free process presented here.

The repair results can be flexibly influenced for example by the following parameters: ion dose, size of the selected repair area, acceleration voltage of the gallium ions, number of scanning points when scanning the repair location and/or the residence duration on the scanning points.

The method according to the invention therefore represents an improvement compared with carbon deposition for the repair of bright defects.

FIG. 4A reveals that the intensity is uniform throughout, i.e. the repaired defect is indiscernible.

The specifications are completely fulfilled.

Figure 4B:
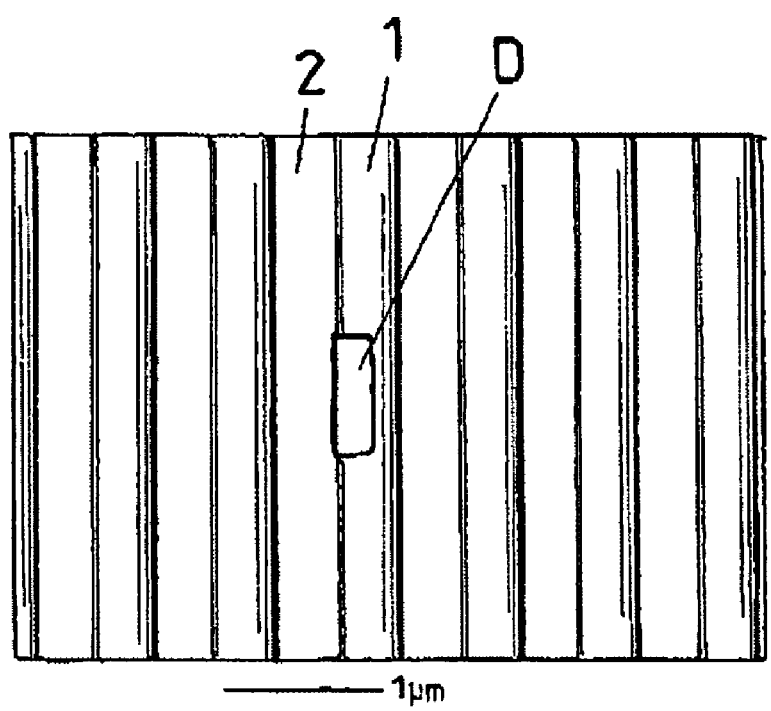
FIG. 4B illustrates a scanning electron microscope recording of a defect repaired by the method according to the invention.

FIG. 4B illustrates a scanning electron microscope image of this repaired defect, in particular the almost complete rectangular form being discernible.

A comparison of FIG. 3B and FIG. 4B shows the advantages of the method according to the invention. In FIG. 3B, even though a rectangular area was selected as repair region in the user interface of the ion beam installation, the region repaired with a carbon deposition has soft edges and rounded corners. A clean rectangle with sharp edges and pointed corners is achieved in the case of a repair by the method according to the invention (FIG. 4B). This illustrates the increased positioning accuracy of the new process.

A deposited carbon layer is additionally characterized by a halo (see FIG. 3B) having a size of several nanometer in the vicinity of the repair location, which arises as a result of interaction between the gas molecules and the edge of the ion beam. The edge of the carbon film is additionally blurred as a result. A pure gallium ion beam in accordance with the method according to the invention does not exhibit a halo.

A photolithographic mask repaired in this way represents a mask according to the invention.

Figure 5:
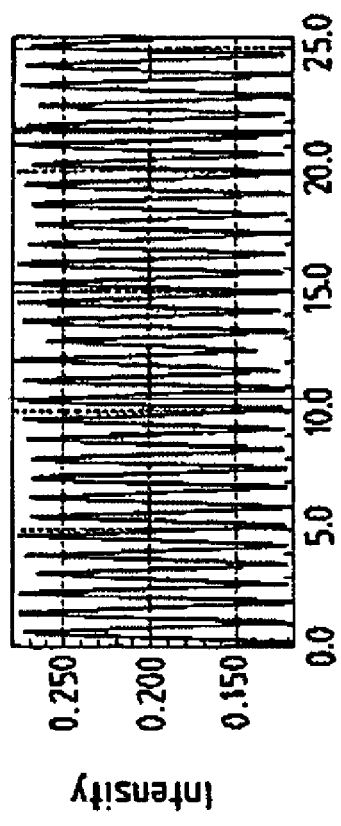
FIG. 5 shows a measurement result (AIMS) of the light transmission of a further defect repaired by the method according to the invention.

FIG. 5 shows the measurement result of a repair according to the invention of a different defect from that illustrated in FIG. 4A. Here, too, the intensity deviation is lower than in the case of the repair with carbon films. The specifications are fulfilled.

Figure 6B:
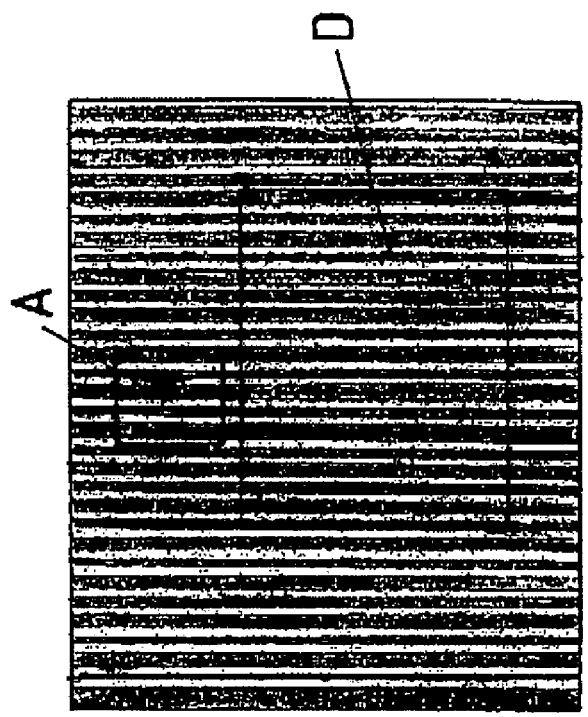
FIG. 6B shows an AIMS measurement of the defect repaired according to the invention in comparison with a defect repaired in a manner not conforming to the specification.
Figure 6A:
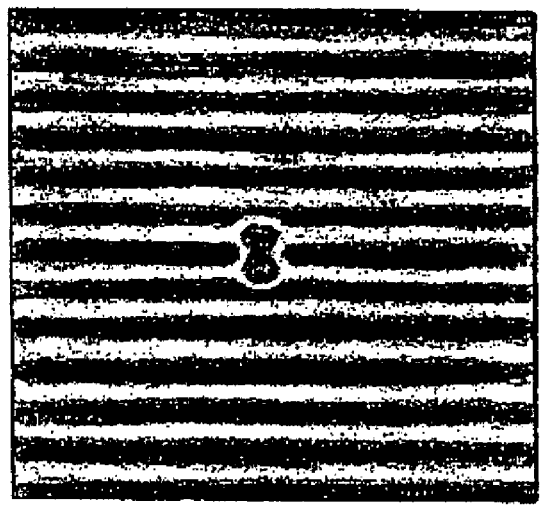
FIG. 6A shows an AIMS measurement of a defect which goes over a plurality of lines.

FIGS. 6A and 6A show that even comparatively large defects which go beyond one line can be repaired successfully by the method according to the invention. This has not been possible hitherto on halftone phase masks for 193 nm with the aid of a carbon layer.

FIG. 6A illustrates a large bright defect A before repair. FIG. 6B illustrates the repaired defect D within the large black rectangle. AIMS measurements are involved in both cases. A precise analysis of the cross sections revealed that the repaired defect D fulfils the specifications in the entire region. For comparison, a defect A' with 15% deviation in the light transmission is situated in the upper small rectangle, which defect had been produced with a conventional repair. This shows that more uniform and large-area results can be achieved by the repair according to the invention by means of irradiation with gallium ions.

The experiments described here were carried out on photo masks with line structures. In principle, the method according to the invention can also be applied to halftone phase masks with different structuring. The method according to the invention can also be applied to bright defects on photo masks appertaining to 157 nm technology.

The embodiment of the invention is not restricted to the preferred exemplary embodiments specified above. Rather, a number of variants are conceivable which make use of the method according to the invention and the photolithography mask according to the invention also in the case of embodiments of fundamentally different configuration.

List of Reference Symbols
A defect
B deviation
C carbon layer
D repaired defect
H halo
1 light-influencing structure
2 quartz substrate

The invention claimed is:

1. A method for repairing at least one defect of a light-influencing structure of a photolithographic mask, the photolithographic mask including a mask substrate comprising quartz, and said light influencing structure formed on a surface of the mask substrate, the method comprising:
irradiating gallium ions in a gas-free manner onto the surface of the mask substrate in a repair region including said at least one defect in a targeted manner such that at least some of the gallium ions are implanted into the mask substrate, wherein said defect comprises a bright defect, and wherein a dose of the implanted gallium ions in the repair region is sufficient to alter dielectric properties of the mask substrate, whereby the bright defect is repaired in the repair region by the implanted gallium ions.

2. The method according to claim 1, wherein said irradiating comprises directing an ion beam from an ion etching installation into the repair region.

3. The method according to claim 1, wherein irradiating comprises controlling a repair result of said at least one defect through at least one of selecting an optimal dose of said gallium ions and selecting an optimal size of the repair region into which said gallium ions are irradiated.

4. The method according to claim 1, wherein the defect is a bright defect of a molybdenum-silicon structure on the mask substrate.

5. The method according to claim 1, wherein irradiating said gallium ions comprises sputtering material away from the mask substrate.

6. A method for repairing at least one defect of a light-influencing structure of a photolithographic mask, the photolithographic mask including a mask substrate comprising quartz, and said light influencing structure formed on a surface of the mask substrate, the method comprising:
directing a gallium beam from an ion etching installation onto the surface of the mask substrate in a repair region including at least one bright defect in a targeted manner such that at least some of the gallium ions are implanted into the mask substrate; and
controlling a repair result of said at least one bright defect through at least one of selecting an optimal acceleration voltage of the gallium ions, selecting a number of scanning points associated with the repair region, and selecting a residence duration of the ion beam on a scanning point, wherein said defect comprises a bright defect, and wherein a dose of the implanted gallium ions in the repair region alters dielectric properties of the mask substrate, whereby said bright defect is repaired in the repair region by the implanted gallium ions.

7. The photolithographic mask according to claim 6, wherein the light-influencing structure comprises molybdenum-silicon, and is designed as part of a halftone phase mask.

8. The photolithographic mask according to claim 6, wherein the mask substrate comprises quartz.

9. A photolithographic mask comprising:
a mask substrate; and
a plurality of light-influencing structures formed on a surface of the mask substrate in a predetermined pattern, wherein at least one light-influencing structure defines a defect,
wherein the mask substrate includes gallium ions implanted into the mask substrate in a targeted manner in a repair region including said defect for the purpose of repairing said defect in said light-influencing structure, wherein said defect comprises a bright defect, and wherein a dose of the implanted gallium ions in the repair region is sufficient to alter the light-influencing properties of the mask substrate, whereby the bright defect is repaired in the repair region byte implanted gallium ions.

10. The photolithographic mask according to claim 9, wherein said photolithographic mask is designed for an exposure wavelength of 193 nm or 157 nm.

11. The photolithographic mask according to claim 9, wherein the light-influencing structure comprises molybdenum-silicon, and is designed as part of a halftone phase mask.

12. The photolithographic mask according to claim 9, wherein the mask substrate comprises quartz.

13. A method for repairing at least one defect of a light-influencing structure of a photolithographic mask, the photolithographic mask including a mask substrate comprising quartz, and said light influencing structure formed on a surface of the mask substrate, the method comprising:
irradiating gallium ions in a gas-free manner onto the surface of the mask substrate in a repair region including said at least one defect in a targeted manner such that at least some of the gallium ions are implanted into the mask substrate, wherein said defect comprises a bright defect, and wherein-the implanted gallium ions in the repair region absorb sufficient light to alter the light-influencing properties of the mask substrate, whereby the bright defect is repaired in the repair region by the implanted gallium ions.

14. The method according to claim 13, wherein said implantation of said gallium ions further comprises sputtering material away from the mask substrate to cause a phase shift of the light.

15. The method according to claim 13, wherein the defect is a bright defect of a molybdenum-silicon structure on the mask substrate.

* * * * *

UNITED STATES PATENT AND TRADEMARK OFFICE
CERTIFICATE OF CORRECTION

PATENT NO. : 7,157,190 B2
APPLICATION NO. : 10/703298
DATED : January 2, 2007
INVENTOR(S) : Ramstein It is certified that error appears in the above-identified patent and that said Letters Patent is hereby corrected as shown below:

Column 8, line 5; delete "byte" insert -- by the--

Signed and Sealed this

Twentieth Day of March, 2007

JON W. DUDAS
*Director of the United States Patent and Trademark Office*